US010229895B2

United States Patent
Gottwald et al.

(10) Patent No.: US 10,229,895 B2
(45) Date of Patent: Mar. 12, 2019

(54) ELECTRONIC SUB-ASSEMBLY AND METHOD FOR THE PRODUCTION OF AN ELECTRONIC SUB-ASSEMBLY

(71) Applicant: Schweizer Electronic AG, Schramberg (DE)

(72) Inventors: Thomas Gottwald, Dunningen (DE); Alexander Neumann, Rottweil (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 14/772,597

(22) PCT Filed: Mar. 12, 2014

(86) PCT No.: PCT/EP2014/000653
§ 371 (c)(1),
(2) Date: Sep. 3, 2015

(87) PCT Pub. No.: WO2014/139674
PCT Pub. Date: Sep. 18, 2014

(65) Prior Publication Data
US 2016/0020194 A1   Jan. 21, 2016

(30) Foreign Application Priority Data
Mar. 13, 2013   (DE) .................. 10 2013 102 542

(51) Int. Cl.
| H05K 3/46 | (2006.01) |
| H05K 1/18 | (2006.01) |
| H05K 3/30 | (2006.01) |
| H01L 25/00 | (2006.01) |
| H01L 23/00 | (2006.01) |

(Continued)

(52) U.S. Cl.
CPC .......... *H01L 25/072* (2013.01); *H01L 21/486* (2013.01); *H01L 21/4857* (2013.01);
(Continued)

(58) Field of Classification Search
CPC . H01L 23/3677; H01L 23/4951; H01L 24/24; H01L 23/5389; H01L 24/01;
(Continued)

(56) References Cited

U.S. PATENT DOCUMENTS

| 5,119,168 A * | 6/1992 | Misawa | ............... H01L 23/5286 |
| | | | 257/691 |
| 6,555,414 B1 * | 4/2003 | Vanfleteren | ........... H01L 21/563 |
| | | | 257/E21.503 |

(Continued)

FOREIGN PATENT DOCUMENTS

WO   WO 02/47162   6/2002

OTHER PUBLICATIONS

The International Bureau, International Preliminary Report on Patentability, Chapter 1, dated Sep. 24, 2015, PCT/EP2014/000653, filed Mar. 12, 2014.
(Continued)

*Primary Examiner* — Mohsen Ahmadi
(74) *Attorney, Agent, or Firm* — Shlesinger, Arkwright & Garvey LLP

(57) ABSTRACT

An electronic sub-assembly (36) comprising at least one electronic component (14) embedded in a sequence of layers, wherein the electronic component (14) is arranged in a recess of an electrically conductive central layer (16) and directly adjoins a resin layer (12, 20) on each side.

8 Claims, 11 Drawing Sheets

(51) Int. Cl.
- *H01L 23/498* (2006.01)
- *H01L 23/538* (2006.01)
- *H01L 25/07* (2006.01)
- *H01L 21/48* (2006.01)

(52) U.S. Cl.
CPC .. *H01L 23/49822* (2013.01); *H01L 23/49827* (2013.01); *H01L 23/49844* (2013.01); *H01L 23/5389* (2013.01); *H01L 24/19* (2013.01); *H01L 24/20* (2013.01); *H01L 24/24* (2013.01); *H01L 24/25* (2013.01); *H01L 24/82* (2013.01); *H01L 24/83* (2013.01); *H01L 25/50* (2013.01); *H05K 1/185* (2013.01); *H05K 3/4608* (2013.01); *H01L 24/29* (2013.01); *H01L 24/32* (2013.01); *H01L 24/75* (2013.01); *H01L 24/92* (2013.01); *H01L 2224/04105* (2013.01); *H01L 2224/221* (2013.01); *H01L 2224/24137* (2013.01); *H01L 2224/2518* (2013.01); *H01L 2224/32013* (2013.01); *H01L 2224/75252* (2013.01); *H01L 2224/7625* (2013.01); *H01L 2224/82001* (2013.01); *H01L 2224/82007* (2013.01); *H01L 2224/82039* (2013.01); *H01L 2224/82105* (2013.01); *H01L 2224/832* (2013.01); *H01L 2224/83048* (2013.01); *H01L 2224/8388* (2013.01); *H01L 2224/83192* (2013.01); *H01L 2224/92144* (2013.01); *H01L 2924/13091* (2013.01); *H01L 2924/3511* (2013.01); *H05K 1/188* (2013.01); *H05K 3/30* (2013.01)

(58) Field of Classification Search
CPC ... H01L 24/82; H01L 25/072; H01L 21/4857; H01L 21/486; H05K 1/0216; H05K 1/188; H05K 3/30
See application file for complete search history.

(56) References Cited

U.S. PATENT DOCUMENTS

| | | | | |
|---|---|---|---|---|
| 7,656,015 B2 * | 2/2010 | Wong | ............. | H01L 23/3677 257/685 |
| 2002/0031866 A1 * | 3/2002 | Jiang | ............. | H01L 23/4951 438/125 |
| 2005/0135065 A1 * | 6/2005 | Nakatsu | ............. | H01L 23/4006 361/703 |
| 2005/0157478 A1 * | 7/2005 | Inagaki | ............. | H01G 4/224 361/763 |
| 2005/0189138 A1 * | 9/2005 | Bardsley | ............. | H05K 3/328 174/260 |
| 2006/0115931 A1 * | 6/2006 | Hsu | ............. | H01L 24/24 438/121 |
| 2006/0145328 A1 * | 7/2006 | Hsu | ............. | H01L 23/5389 257/690 |
| 2008/0029476 A1 * | 2/2008 | Ohmi | ............. | H05K 1/0216 216/13 |
| 2008/0137300 A1 * | 6/2008 | Macris | ............. | H01L 23/10 361/699 |
| 2008/0280392 A1 * | 11/2008 | Stapleton | ............. | C09J 163/00 438/106 |
| 2009/0045507 A1 * | 2/2009 | Pendse | ............. | H01L 21/563 257/734 |
| 2009/0072384 A1 | 3/2009 | Wong et al. | | |
| 2009/0080169 A1 * | 3/2009 | Webster | ............. | H01L 23/49816 361/772 |
| 2009/0205202 A1 * | 8/2009 | Tanaka | ............. | H01L 24/82 29/834 |
| 2010/0018761 A1 * | 1/2010 | Wang | ............. | H01L 23/5389 174/260 |
| 2010/0155124 A1 * | 6/2010 | Kawamura et al. | ............. | H01L 24/24 174/260 |
| 2010/0170085 A1 * | 7/2010 | Schaaf | ............. | H01L 23/3121 29/832 |
| 2010/0328913 A1 * | 12/2010 | Kugler | ............. | H01L 24/18 361/761 |
| 2011/0290540 A1 * | 12/2011 | Jung | ............. | H01L 23/13 174/255 |
| 2016/0020194 A1 * | 1/2016 | Gottwald | ............. | H05K 3/4608 257/774 |

OTHER PUBLICATIONS

Office Action in the corresponding Chinese application 201480025065.X, dated May 31, 2017.

* cited by examiner

ELECTRONIC SUB-ASSEMBLY AND METHOD FOR THE PRODUCTION OF AN ELECTRONIC SUB-ASSEMBLY

TECHNICAL AREA

The present invention relates to an electronic sub-assembly as well as a method for producing an electronic sub-assembly.

DESCRIPTION OF THE STATE OF THE ART

Electronic sub-assemblies are known. They usually comprise a more or less complex layered structure made of (electrically) conductive and non-conductive layers, and are—within or on the sequence of layers—equipped with electronic components (such as power semiconductors, etc.). Connection of the components is made through the layers of the layered structure above them.

SUMMARY OF THE INVENTION

According to the invention, a method for producing an electronic sub-assembly with the features as disclosed herein, as well as an electronic sub-assembly with the features as disclosed herein, and a printed circuit board (PCB) as disclosed herein comprising an electronic sub-assembly according to the invention are provided.

The idea according to the invention consists in providing an electronic sub-assembly having a symmetrical layered structure with regard to the at least one electronic component provided within the sub-assembly. A further idea according to the invention consists in providing an electronic sub-assembly in which power-electronics components are embedded in a laminate without prior electrical connection of at least one connection.

This is achieved by mounting the component in a slightly heated state directly onto an electrically insulating layer. Thus, according to the invention, an additional work step of soldering, sintering or gluing can be dispensed with. A sufficient securing of the mounted component is achieved, at least in the area below the component, by the temporary liquefaction and subsequent re-hardening (curing) of the electrically insulating layer.

During the later lamination process this layer can, however, become soft again, which might result in the loss of positioning accuracy. In order to prevent this, according to the invention, a "shadow mask" or hole mask, which is to be introduced into the layered structure, is provided as the next layer, which shadow mask will serve as a "template", holding the component in its position during the pressing or lamination. This layer comprises at least one recess whose dimensions are determined by the component to be received such that the recess will enclose the component tightly, preventing any slippage during further processing. In addition, this layer is used for creating a low-resistance heat sink path, as well as for providing a low-ohmic connection from the component to the high-current path.

This allows building a symmetrical layer structure so that the at least one component is embedded in a sequence of layers that is identical "upwards" and "downwards". Correlating layers can each have equal dimensions so that differences in tension between the areas "above" and "below" the component are mostly excluded. This will prevent thin components (semiconductors) from warping.

It is understood that the sequence of mounting of at least one electronic component and the laying of the "shadow mask" can be reversed within the framework of the invention by first depositing the shadow mask on the electrically insulating layer and then inserting the at least one electronic component into the at least one recess provided for this purpose in the "shadow mask". In order to achieve a flat positioning of the shadow mask on the surface of the electrically insulating layer, the shadow mask can have been slightly heated when it is deposited on the electrically insulating layer in order to achieve the same effect as described above in the context of mounting the electronic component.

The fact that the at least one component has been inserted into a sheet metal layer of essentially the same thickness, which layer surrounds the component completely, will additionally result in low thermal resistance at high thermal capacity.

Furthermore, the elimination of a connecting point (i.e., solder, sinter, or gluing location) below the component will considerably reduce the vulnerability.

Additional advantages and embodiments of the invention become clear from the description and accompanying drawing.

It is evident that the features mentioned above and those yet to be explained below may be applied not only in the combinations indicated, but also in other combinations or individually, without going beyond the scope of the present invention.

The invention is represented for illustrative purposes by means of exemplary embodiments depicted via schematic drawings (not to scale) and is described in detail herein, with references to the drawings.

DETAILED DESCRIPTION

Figure 1:
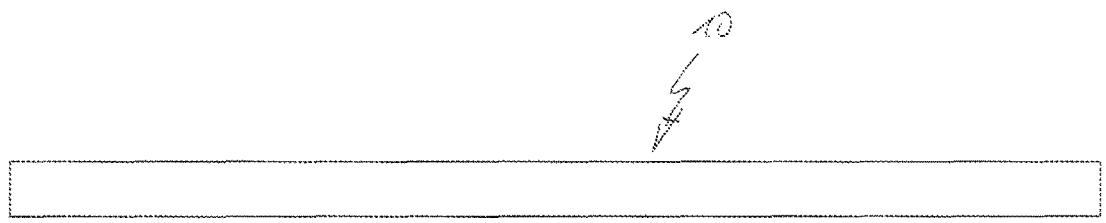
FIG. 1 shows a starting substrate for an electronic sub-assembly of the invention.

FIG. 1 shows a starting or base substrate 10 for an electronic sub-assembly according to the invention. The starting substrate 10 is made of an electrically conductive material. This can be copper sheet metal. Alternatively, it can also be a substrate made of a material with a low heat expansion coefficient; e.g., of a suitable iron-nickel alloy covered with copper on both sides. An example for the latter is copper-Invar®-copper sheet metal (CIC sheet metal), as it is commercially available ready-made. Typical thicknesses of such a commercially available ready-made CIC layer are 150 μm of Invar® and 18 μm each of copper.

Figure 2:
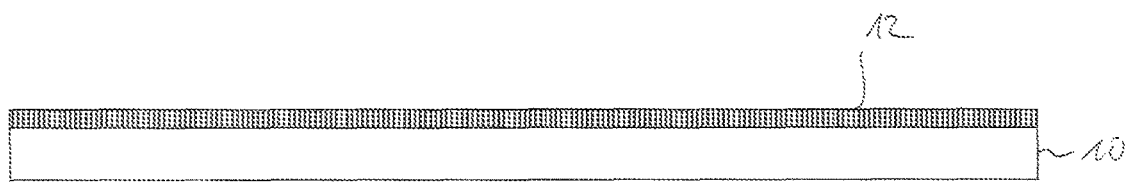
FIG. 2 shows the starting substrate of FIG. 1 with an electrically insulating layer placed thereon.

In a next step, a first layer 12 made of an electrically insulating material is deposited on the base or starting substrate 10 (cf. FIG. 2). Said first layer is a layer made of a material that contains resin and is curable, as it is well known in the production of electronic sub-assemblies. The person skilled in the art also calls such a material a prepreg, which is an abbreviation for "preimpregnated fibers".

Figure 3:
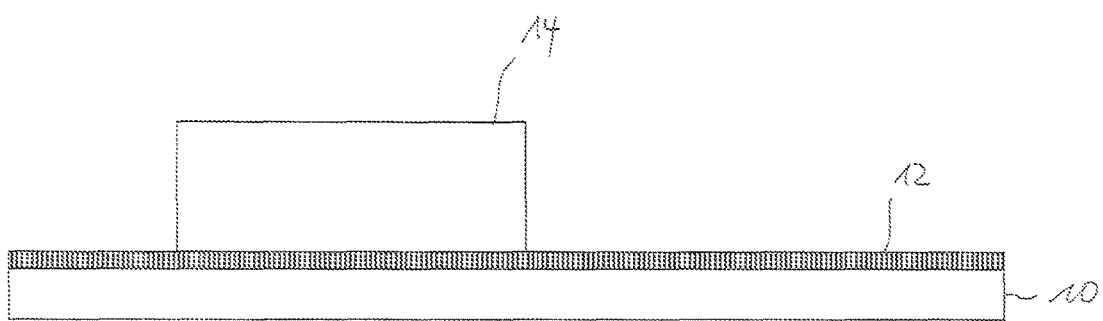
FIG. 3 shows the sequence of layers of FIG. 2 with an electronic component mounted thereon.

The first layer 12 made of an electrically insulating material is then directly equipped with a component 14 (e.g., a power component, semiconductor chip) as shown in FIG. 3.

According to the invention, the component 14 has been slightly heated for mounting. Such a mounting according to the invention exploits the fact that the resin material of the first layer 12 made of an electrically insulating material (henceforth, for simplicity's sake, referred to as a 'prepreg layer') liquefies at increased temperatures; if a heated component 14 is now placed on the prepreg layer 12, this will result in partial liquefaction—limited to the area below the component 14—of the prepreg material, followed by curing after cooling, thus adhering or attaching the component. Thus, the component 14, merely from heating and without additional tools (e.g., adhesives or such), is sufficiently secured to the desired location for further machining or processing. The component 14 is heated, e.g., by means of a heated installation tool, such as a so-called thermode.

Figure 4A:
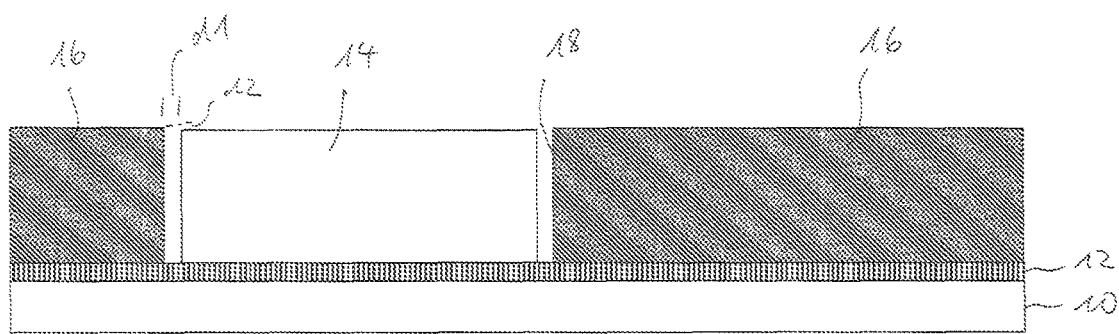
FIG. 4A shows the sequence of layers of FIG. 3 with an electrically conductive layer having a recess applied thereon.

In a next step, a first electrically conductive layer 16 having at least one recess 18 will be laid on. This layer 16 may, e.g., be a "shadow mask" or template consisting of, e.g., copper sheet metal or such. Arrangement and dimensions of the at least one recess 18 are designed for the at least one mounted component 14 (cf. FIG. 4A). Or in other words: width and depth (i.e., the X- and Y-axis extensions) of the recess 18 correspond to the width and depth of the component 14 plus a positioning tolerance $d1$, and the height of the recess 18 (i.e., the thickness of its material) corresponds to the height of the component 14 plus a make-up tolerance $d2$ for the (slight) loss in height resulting during the subsequent compression (lamination) process of the first electrically conductive layer 16 (and for relieving pressure on component 14 during the compression).

The step of mounting of at least one component 14, 42, 44 is followed by the step of laying the first electrically conductive layer 16, wherein the at least one component 14, 42, 44 has an elevated temperature at the moment of mounting, or in which the step of laying the first electrically conductive layer 16 is followed by the step of mounting of at least one component 14, 42, 44, wherein the first electrically conductive layer 16 has an elevated temperature at the moment of mounting.

Figure 4B:
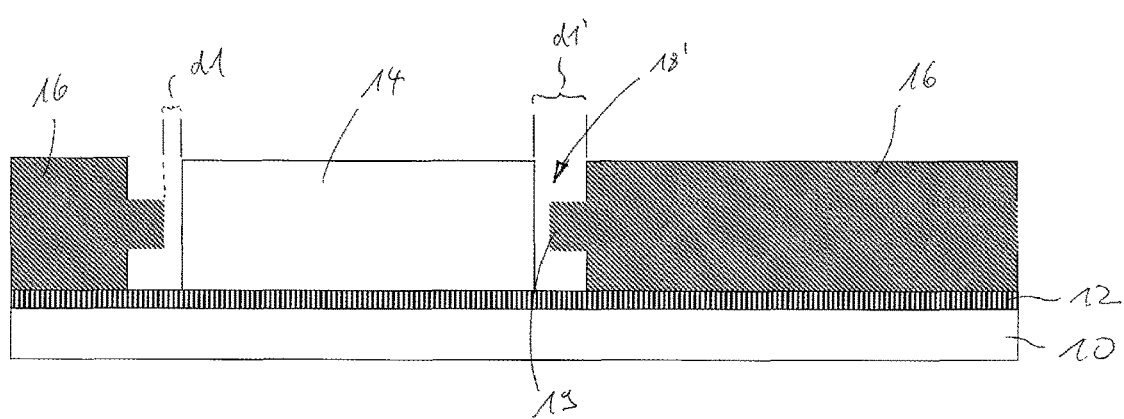
FIG. 4B shows the sequence of layers of FIG. 4A with an alternative embodiment of the electrically conductive layer having a recess.

FIG. 4B shows an alternative embodiment of the "shadow mask" or template, in which the recess 18' of the electrically conductive layer 16 possesses a gradation or a shoulder-shaped cross-section. On the one hand, while the recess of the "shadow mask" is to be at a distance from the component (chip) 14, it shall, however, also be as close as possible to it in order to guarantee that the component is secured during further processing. On the other hand, however, there is a risk that, if the distance $d1$ between the component 14 and the electrically conductive layer 16 is too small, an electrical discharge may occur. In order to prevent this, the recess 18' is designed to have a larger diameter towards the upper and lower sides of the electrically conductive layer so that the distance between the component 14 and the electrically conductive layer 16 is increased on the conductive surfaces of the component by so much that the risk of an electric discharge can be excluded, or is greatly reduced. In a center area of the electrically conductive layer 16, the smaller distance $d1$ will be maintained because of the projection 19 of said gradation, so that the securing function continues to be ensured. Here, while the term "diameter" has been chosen with regard to the cross-sectional representations in the figures, the recess should not be understood to be round; instead, the recess may assume any shape, e.g., rectangular, polygonal, irregular, or such.

Figure 4C:
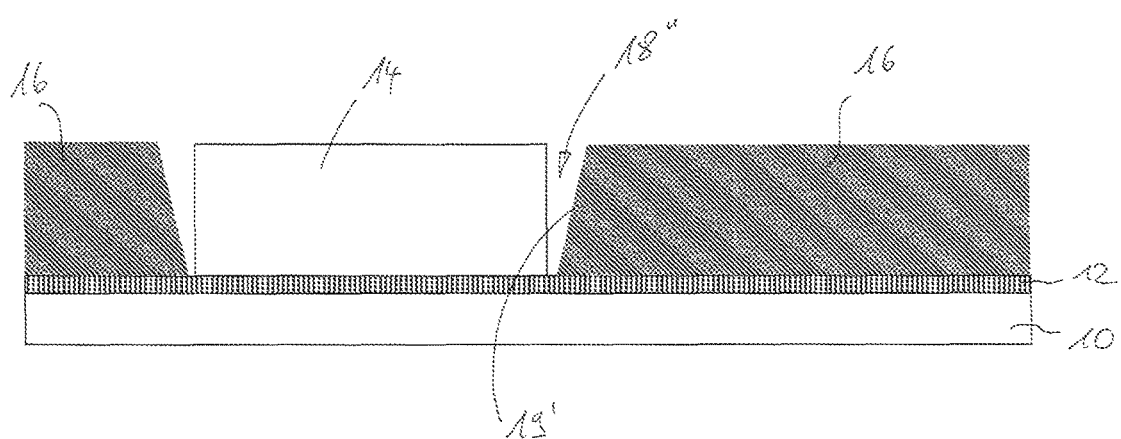
FIG. 4C shows the sequence of layers of FIG. 4A with another alternative embodiment of the electrically conductive layer having a recess.

It is to be emphasized that the design of the projection 19 is not limited to the shape shown in FIG. 4B, and that other shapes are possible and obvious to the person skilled in the art. In particular, a design with oblique (funnel-shaped) surfaces 19' is imaginable, which will facilitate subsequent insertion of the component, such as this is illustrated for example by means of the recess 18'' of the embodiment shown in FIG. 4C. A "double-funnel shape" is also possible. The illustrations of FIGS. 4B and 4C are very schematic and serve illustrative purposes only; the dimensions shown are not to scale, and heights are greatly exaggerated.

The positioning tolerance $d1$ can, e.g., lie in the 3 μm order of magnitude for so-called high-precision chip shooters, and in the roughly 25 to 50 μm order of magnitude for high-speed shooters. The dimensions of the recess typically lie within an order of magnitude from 50 to 100 μm, due to the precision of the placement of the template itself. The equalization tolerance $d2$ can, e.g., be between 0 and 30 μm, the amount by which the sheet metal of the shadow mask 16 is greater in thickness. The thickness (i.e., height) of the first electrically conductive layer 16 can be adjusted to the component's height with relatively little effort (e.g., by rolling, electroplating, or in combination with a deposit generated by an electrolytic method).

Figure 5:
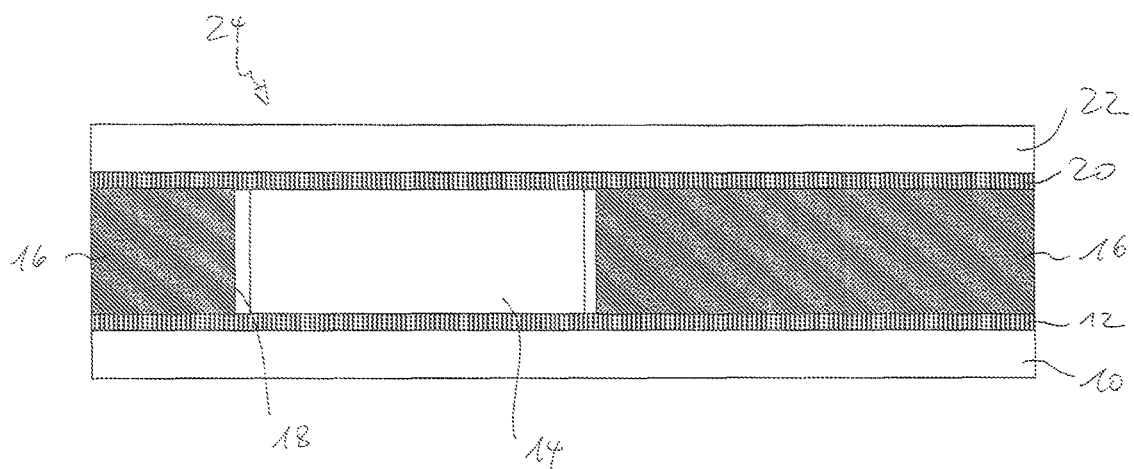
FIG. 5 shows the sequence of layers of FIG. 4A with prepreg and copper layers applied on each side.

Subsequently, a second layer 20 made of electrically insulating material, and at least one second electrically conductive layer 22 are applied, as illustrated in FIG. 5. The second layer 20 made of electrically insulating material can again be a prepreg layer having increased thermal conductivity, and the second electrically conductive layer 22 can be a copper layer or a CIC layer (as described above). The resulting sequence of layers 24 is then compressed/laminated in the usual manner.

According to the invention, the sequence of layers 24 is designed such that a symmetrical structure results; i.e., of a component 14 embedded in a central layer (the first electrically conductive layer), which component is covered on both sides (i.e., in the two directions perpendicular to the structure's principal plane of extension, and thus of the component and the central layer) with a prepreg layer 12, 20 and conductive layers 10, 22 (the starting substrate and the second electrically conductive layer) positioned on said prepreg layer.

As can also be seen in the illustrations of the figures, the surfaces with which the at least one component is in both upward and downward contact are uniform; i.e., there are no or only very minor differences, in order to minimize differences in surface tension. This allows considerably reducing or mostly preventing deformations in the embedded components.

In this context it must be pointed out that within the framework of this application, the terms "upward" and "downward" must be understood to apply to the orientation of the component and the sequence of layers. It is evident that these are relative terms which will fundamentally change if the sequence of layers is flipped, which will, however, remain without consequences with regard to its symmetric structure according to the invention. This is, however, quite evident to the person skilled in the art.

Figure 6:
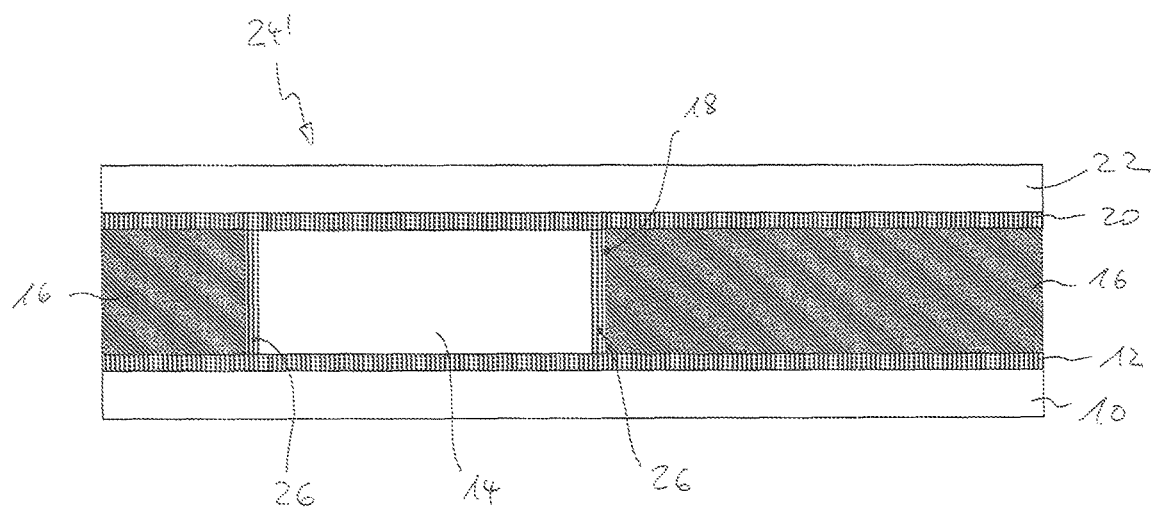
FIG. 6 shows the sequence of layers of FIG. 5 after pressing or laminating.

The compressed state 24' of the sequence of layers 24 is shown in FIG. 6. During the compression process, the component 14 will be held in its position by the tightly dimensioned recess 18 of the first electrically conductive layer 16, and liquefied resin from the prepreg layers 12, 20, which are located on either side of component 14, will enter the intermediate spaces d1 between the component 14 and the first electrically conductive layer 16. The liquefied resin then cures, filling said intermediate spaces with rigid material 26.

Figure 7:
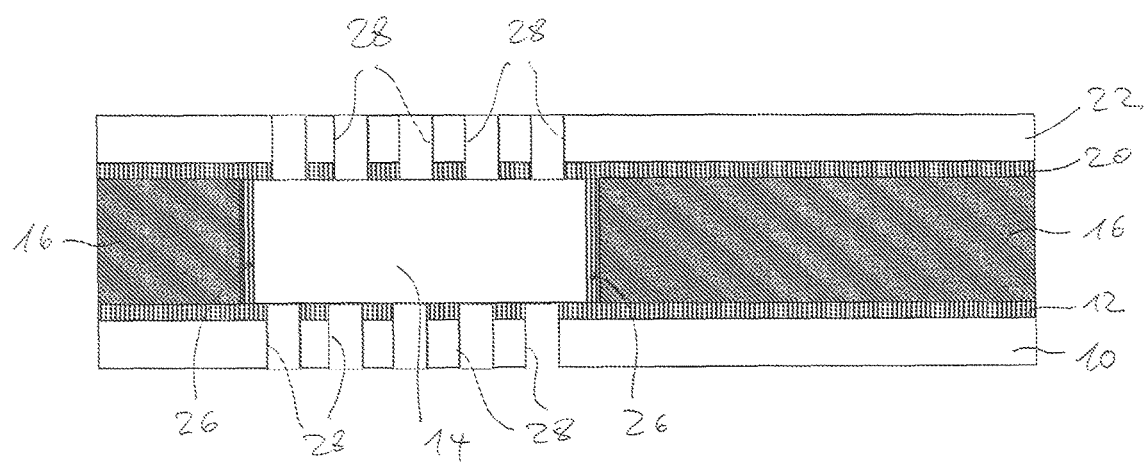
FIG. 7 shows the sequence of layers of FIG. 6 with blind holes for making connections, which blind holes have been applied to both sides.

FIG. 7 shows how, in a subsequent step, blind holes 28 leading to the two surfaces of the component 14 are made on both sides in the layers 10, 12 and 20, 22. This is done in a manner known to the person skilled in the art; e.g., by means of a laser method or an etching method. It proves particularly advantageous that the connection of the at least one component occurs, according to the invention, completely after the embedding method, eliminating a preceding construction and connection process.

The blind holes 28 for connecting to the component 14 are then filled with a conductive material, such as, in particular, copper. This is done, e.g., by means of a plating method in which on both sides of the sequence of layers, a copper layer 30, 32, which also fills blind holes 28 (cf. FIG. 8), is applied on each of the outermost conductive layers 10, 22. For this purpose, the at least one component has a surface that allows electrolytic connection with sufficiently high adhesiveness, such as copper. The deposited copper layers 30, 32 are then, depending on the further design of the PCB's function, submitted to a so-called photo-lithographic structuring method; i.e., a resist deposit followed by exposure, development, and etching methods in order to, e.g., create the transistor array described below. This is a procedure known to the person skilled in the art.

Figure 8:
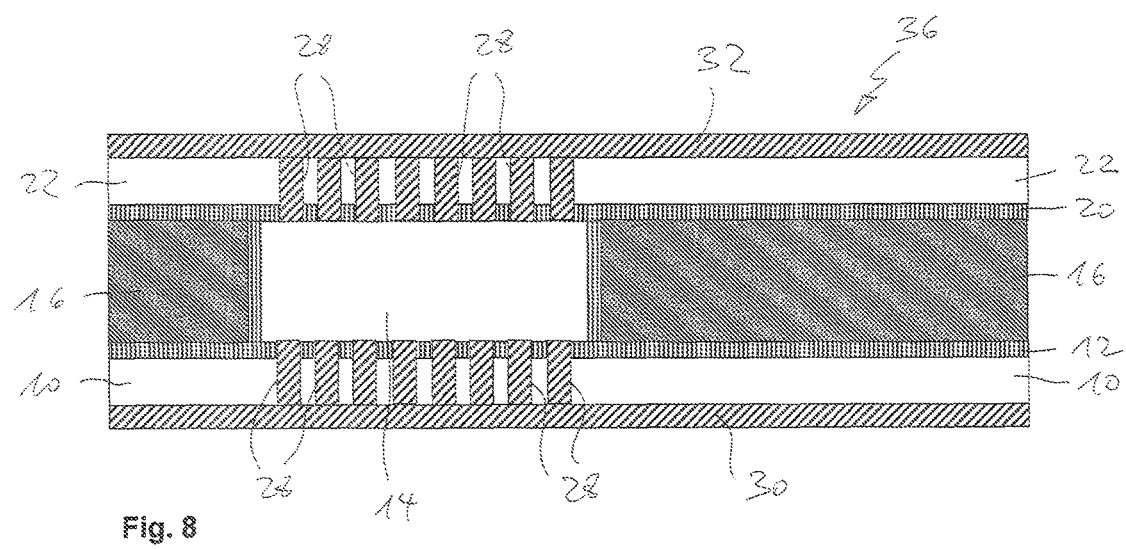
FIG. 8 shows the sequence of layers of FIG. 7 with plated or, respectively, filled blind holes.

As can be seen from the illustrations of FIGS. 7 and 8, the sequence of layers of the invention, even after the vias 28 have been made and filled, is characterized by layer symmetry, with the component 14 in the center.

This layer symmetry according to the invention can be utilized for an advantageous construction of the electronic sub-assembly; i.e., when designing the sub-assembly, as will be described below.

Figure 9:
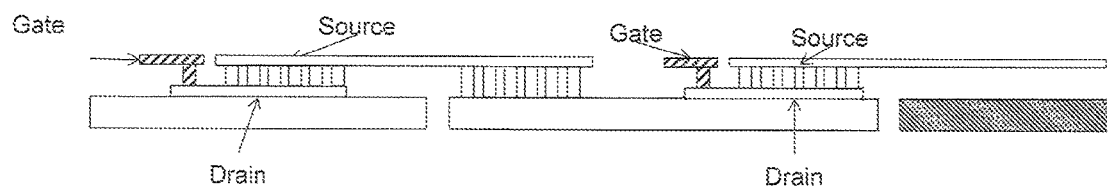
FIG. 9 shows an array of transistors according to the prior art.

Usually, when designing electronic sub-assemblies that must be equipped with active components (such as MOSFET transistors), it must be taken into account that the at least three terminals or connections (gate, source, drain) of such a component lie on opposite sides of the component, and that thus, when they are equipped with several components/transistors (e.g., for implementing a bridge circuit), a complicated structure with additional vias or additional connections above the components will be necessary. Such a known construction is shown schematically in FIG. 9.

The invention allows a clearly simpler construction, as connection with the component can now be made from both sides, thus allowing components to be arranged alternately (e.g., drain above/source below, followed by drain below/source above, etc.).

Figure 10:
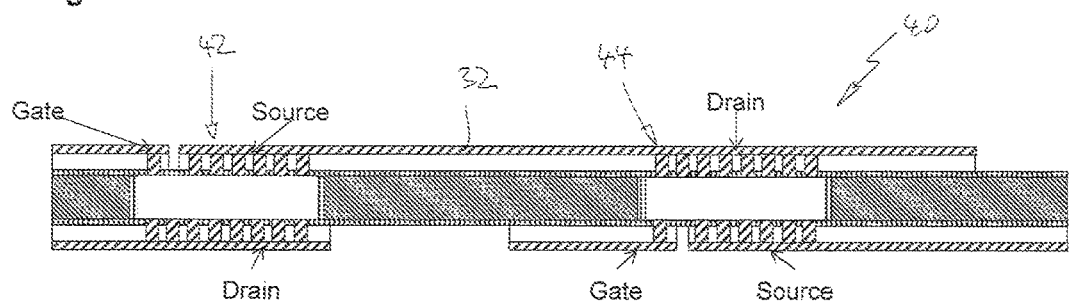
FIG. 10 shows an array of transistors according to the invention.

This is illustrated in FIG. 10. FIG. 10 shows a structure of layers 40 according to the invention with two transistor components 42, 44 (for simplicity's sake, henceforth referred to as transistors).

The first transistor 42, on the left-hand side in the illustration from FIG. 10, points downwards with its drain terminal D1, and upwards with its gate and source terminals G1, S1. The terminals D1, G1, S1 are connected, as described above, with connections formed by the blind holes 28. The second transistor 44, on the right-hand side in the illustration of FIG. 10, points upwards with its drain terminal D2, while gate and source terminals G2, S2, accordingly, point downwards. The two transistors 42, 44 are thus arranged alternately to each other in their orientation.

Thus, as can be seen in the illustration of FIG. 10, according to the invention, the source and drain terminals of adjacent transistors can be connected to each other easily, as they are now positioned on one connection plane. In the example shown this means that the source terminal S1 of the first transistor 42 can simply be connected to the drain terminal D2 of the second transistor 44 across the plane of the plated layer 32.

The alternating transistor orientation according to the invention (in the vertical orientation, i.e., along a longitudinal extension of the electronic sub-assembly 40, or a plane formed by the electronic sub-assembly 40, as shown by the illustration of FIG. 10) can also be described as a "face up/face down" arrangement.

The template or shadow mask of the first conductive layer 16 (the center layer in the finished electronic sub-assembly) can be divided into segments by a combination of penetrations and lands. After the laminating (compressing) process has been completed, the lands can be removed from the outside, creating areas that can be connected to different voltages. The lands are part of what has been laminated into the structure of layers, and they are removed when the overall structure is drilled. The drilling diameter for this process corresponds at least to the length of the land. Due to this measure, the conductive center layer, after the circuit arrangement has been completed, can be used for transporting high currents with low resistance. By conducting current internally (i.e., within the conductive center layer) in the electronic sub-assembly, and in at least one of the outer layers, a very low-induction connection can be achieved, which is advantageous for low-loss operation of the circuit.

An integration of the "template" 16 into the electrical functionality of the electronic sub-assembly can be envisaged, e.g., by connecting an outer layer to a desired portion of the layer 16, e.g., by means of blind holes (not shown in detail). Other types of connections will also reveal themselves to the person skilled in the art, if necessary.

Due to the two-sided connection of the at least one embedded electronic component according to the invention, the finished electronic sub-assembly's exterior will not be potential-free. Consequently, as a rule, electrical insulation will be required, e.g., with respect to a well known cooling unit to be provided (not described or shown). Additional options are providing an insulating layer by using a so-called thermal interface material (TIM), or at least another insulating layer by means of additional compressing. When the completed electronic sub-assembly is installed on a PCB, electrical insulation will be provided by embedding into the electrically insulated layers of the PCB's structure. A person skilled in the art is familiar with any measures necessary for this purpose.

The invention claimed is:

1. A method for producing an electronic sub-assembly with the following steps:
   providing an electrically conductive starting substrate;
   placing at least one first layer made of electrically insulating material;
   mounting of at least one component on the at least one first layer of electrically insulating material;
   laying on the at least one first layer of electrically insulating material a first electrically conductive layer having at least one recess, the at least one recess being designed in its arrangement and dimensions to match the at least one component so that the at least one component is disposed in the at least one recess;
   applying at least a second layer made of electrically insulating material, and at least a second electrically conductive layer;
   pressing together the electrically conductive starting substrate, the at least one first layer made of electrically insulating material, the first electrically conductive layer, the at least a second layer made of electrically insulating material and the at least a second electrically conductive layer; and
   wherein the step of mounting of the at least one component is followed by the step of laying the first electrically conductive layer, wherein the at least one component has an elevated temperature at the moment of mounting to liquefy the at least one first layer of electrically insulating material below the at least one component.

2. The method according to claim 1, wherein the at least one component is a power semiconductor, or mounting is performed using a thermode.

3. The method according to claim 1, wherein the at least one component and the first electrically conductive layer are essentially of the same height, or wherein the first electrically conductive layer is essentially of the same height as the at least one component plus an equalization tolerance.

4. The method according to claim 1, wherein the at least one recess in the first electrically conductive layer corresponds in its dimensions of width and depth, respectively, at least in portions to the dimensions of the at least one component plus a position tolerance.

5. The method according to claim 1, and further comprising the step of providing vias on both sides of the at least one component.

6. The method according to claim 5, wherein the step of providing the vias includes laser drilling and subsequent electroplating, or etching the electrically conductive starting substrate and the at least a second electrically conductive layer and laser drilling of the at least one first layer made of electrically insulating material and the at least a second layer made of electrically insulating material with subsequent electroplating.

7. The method according to claim 1, wherein the step of mounting comprises mounting of at least two power semiconductors that are arranged alternating with each other in a vertical direction with their terminals.

8. A method for producing an electronic sub-assembly with the following steps:
   providing an electrically conductive starting substrate;
   placing at least one first layer made of electrically insulating material;
   mounting of at least one component on the at least one first layer of electrically insulating material;
   laying on the at least one first layer of electrically insulating material a first electrically conductive layer having at least one recess, the at least one recess being designed in its arrangement and dimensions to match the at least one component so that the at least one component is disposed in the at least one recess;
   applying at least a second layer made of electrically insulating material, and at least a second electrically conductive layer;
   pressing together the electrically conductive starting substrate, the at least one first layer made of electrically insulating material, the first electrically conductive layer, the at least a second layer made of electrically insulating material and the at least a second electrically conductive layer; and
   wherein the step of laying the first electrically conductive layer is followed by the step of mounting of the at least one component, wherein the first electrically conductive layer has an elevated temperature at the moment of mounting.

* * * * *